United States Patent
Weng et al.

(10) Patent No.: US 9,971,060 B2
(45) Date of Patent: May 15, 2018

(54) SENSOR CAPABLE OF DETECTING WIDE-RANGE AMBIENT SIGNALS AND ENSURING PROXIMITY SENSING ACCURACY AND METHOD FOR FABRICATING THE SAME

(71) Applicant: SensorTek technology Corp., Hsinchu County (TW)

(72) Inventors: Huan-Hsiang Weng, Hsinchu County (TW); Feng-Jung Hsu, Hsinchu County (TW); Chu-Yuan Yang, Hsinshu County (TW); Chih-Wei Chen, Hsinchu County (TW); Yi-Hua Chang, Hsinchu County (TW)

(73) Assignee: SensorTek technology Corp., Hsinchu County (TW)

( * ) Notice: Subject to any disclaimer, the term of this patent is extended or adjusted under 35 U.S.C. 154(b) by 0 days. days.

(21) Appl. No.: 15/222,926

(22) Filed: Jul. 28, 2016

(65) Prior Publication Data
US 2017/0186886 A1    Jun. 29, 2017

Related U.S. Application Data

(60) Provisional application No. 62/271,309, filed on Dec. 27, 2015.

(51) Int. Cl.
| | |
|---|---|
| *H01L 31/16* | (2006.01) |
| *G01V 8/20* | (2006.01) |
| *G01J 1/42* | (2006.01) |
| *G01J 1/02* | (2006.01) |
| *G01S 17/02* | (2006.01) |

(Continued)

(52) U.S. Cl.
CPC .............. *G01V 8/20* (2013.01); *G01J 1/0266* (2013.01); *G01J 1/0271* (2013.01); *G01J 1/4204* (2013.01); *G01S 7/481* (2013.01); *G01S 7/497* (2013.01); *G01S 17/026* (2013.01); *H01L 31/16* (2013.01)

(58) Field of Classification Search
None
See application file for complete search history.

(56) References Cited

U.S. PATENT DOCUMENTS

| 6,999,685 | B1 * | 2/2006 | Kawase | A61B 5/0031 |
| | | | | 398/129 |
| 8,786,548 | B2 * | 7/2014 | Oh | H04M 1/22 |
| | | | | 345/158 |

(Continued)

FOREIGN PATENT DOCUMENTS

| CN | 103809210 A | 5/2014 |
| CN | 103913449 A | 7/2014 |

(Continued)

OTHER PUBLICATIONS

Shih et al, "light source device", Mar. 10, 2012, Capella microsystems, TW201407448.*

*Primary Examiner* — Bilkis Jahan
(74) *Attorney, Agent, or Firm* — Winston Hsu (57) ABSTRACT

A sensor includes a first reception unit configured for sensing a first signal of a first frequency band and a second reception unit configured for sensing a second signal of a second frequency band. There is a height difference between the first reception unit and the second reception unit.

3 Claims, 12 Drawing Sheets (51) Int. Cl.
   *G01S 7/481*   (2006.01)
   *G01S 7/497*   (2006.01)

(56) References Cited

U.S. PATENT DOCUMENTS

| | | | | |
|---|---|---|---|---|
| 2003/0107719 A1* | 6/2003 | Chen | ............... | G03F 7/70641 |
| | | | | 355/55 |
| 2011/0024627 A1* | 2/2011 | Yao | ............... | G01J 1/02 |
| | | | | 250/338.4 |
| 2013/0242183 A1* | 9/2013 | Lee | ............... | G03B 17/02 |
| | | | | 348/374 |
| 2014/0070101 A1* | 3/2014 | Matsushima | ............... | G01N 21/17 |
| | | | | 250/338.5 |
| 2016/0077218 A1* | 3/2016 | Loi | ............... | G01N 15/02 |
| | | | | 250/370.02 |

FOREIGN PATENT DOCUMENTS

| | | |
|---|---|---|
| TW | 201337391 A | 9/2013 |
| TW | 201407448 A | 2/2014 |
| TW | 201418745 A | 5/2014 |

\* cited by examiner

SENSOR CAPABLE OF DETECTING WIDE-RANGE AMBIENT SIGNALS AND ENSURING PROXIMITY SENSING ACCURACY AND METHOD FOR FABRICATING THE SAME

CROSS REFERENCE TO RELATED APPLICATIONS

This application claims the benefit of U.S. provisional application No. 62/271,309 filed on 2015 Dec. 27, included herein by reference in its entirety.

BACKGROUND OF THE INVENTION

1. Field of the Invention

The present invention relates to a sensor and sensor fabricating method, and more particularly, to sensor and sensor fabricating method capable of detecting ambient signals in a wider range and ensuring proximity sensing accuracy.

2. Description of the Prior Art

Figure 1:
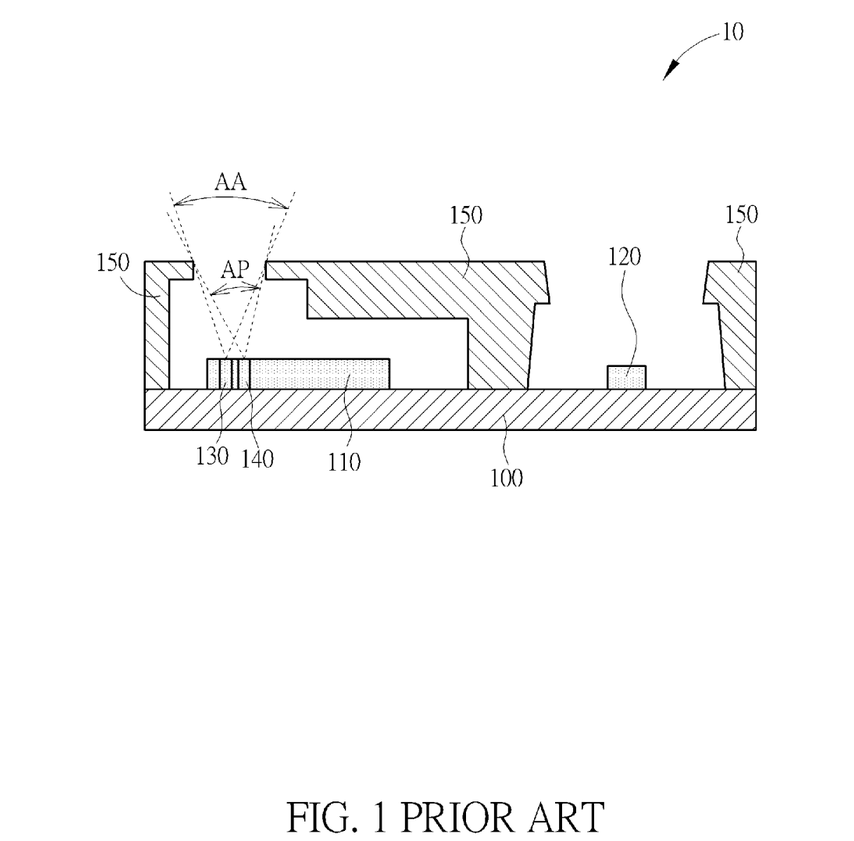
FIG. 1 is a schematic diagram of a cross plane of a conventional sensor.

Please refer to FIG. 1, which is a schematic diagram of a cross plane 10 of a conventional sensor. The sensor 10 includes a substrate 100, an integrated circuit module 110, a signal emitting unit 120 and a package housing 150. The integrated circuit module 110 includes a proximity sensing element (e.g. proximity sensor, PS) 130 and an ambient sensing element (e.g. ambient light sensor, ALS) 140. The signal emitting unit 120 is utilized for emitting signals such as magnetic signals, electrical signals or electromagnetic signals (e.g. light signals), sonic signals. When an object to be sensed (not shown) is close to the sensor 10, the object to be sensed can reflect the signal emitted by the signal emitting unit 120 back to the proximity sensing element 130, and thus the proximity sensing element 130 can detect the object to be sensed in a specific direction. Therefore, the sensor 10 is widely used in smart electronic devices. For example, a robot can determine obstacles in the front by the proximity sensor 130, and a smart phones are equipped with the proximity sensor 130 to determine whether a user is close to a touch panel, so as to control the control touch panel to lock, turn on or turn off during a call, thereby avoiding a face of the user making false operation on the touch panel.

As shown in FIG. 1, in general, the proximity sensing element 130 is combined with the ambient sensing element 140 to form the sensor 10. The ambient sensing element 140 receives nearby ambient signals (such as ambient light) to determine strength of ambient signals, to adjust light intensity of a display panel or provide data for the proximity sensing element 130 to calibrate accordingly. Because light intensity can be distributed unevenly in a space, a light sensing angle AA of the ambient sensing element 140 should be enlarged to ensure the ambient sensing element 140 to receive lights from different directions. Besides, since the conventional sensor 10 disposes the proximity sensing element 130 and the ambient sensing element 140 adjacently, and the proximity sensing element 130 and the ambient sensing element 140 is at a same height, when the ambient sensing element 140 is lifted to enlarge the light sensing angle AA of the ambient sensing element 140, a light sensing angle AP of the proximity sensing element 130 is enlarged accordingly. However, the proximity sensing element 130 unselectively receives all nearby signals. Once the light sensing angle AP of the proximity sensing element 130 is too large, the proximity sensing element 130 not only receives signals from the signal emitting unit 120, but also suffers from stronger interference, such as receiving stronger interference from ambient light and reflecting signals of internal elements of the sensor 10. This affects accuracy of proximity sensing.

As such, how to enlarge the light sensing angle AA of the ambient sensing element 140 without affecting the proximity sensing element 130 is currently studied in the industry.

SUMMARY OF THE INVENTION

It is therefore an objective of the present invention to provide a sensor and sensor fabricating method capable of detecting ambient signals (such as ambient light) in a wider range and ensuring proximity sensing accuracy without suffering from ambient signals affecting accuracy of proximity sensing, to solve the above issue.

The present invention discloses a sensor. The sensor includes a first receiving unit, for sensing a first signal of a first frequency band, and a second receiving unit, for sensing a second signal of a second frequency band, wherein there is a height difference between the second receiving unit and the first receiving unit The present invention further discloses a sensor fabricating method. The sensor fabricating method includes fabricating a first receiving unit in an integrated circuit module, wherein the first receiving unit is utilized for sensing a first signal of a first frequency band, disposing a second receiving unit on the integrated circuit module, wherein the second receiving unit is utilized for sensing a second signal of a second frequency band, and there is a height difference between the second receiving unit and the first receiving unit, and disposing the integrated circuit module on a substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 2A:
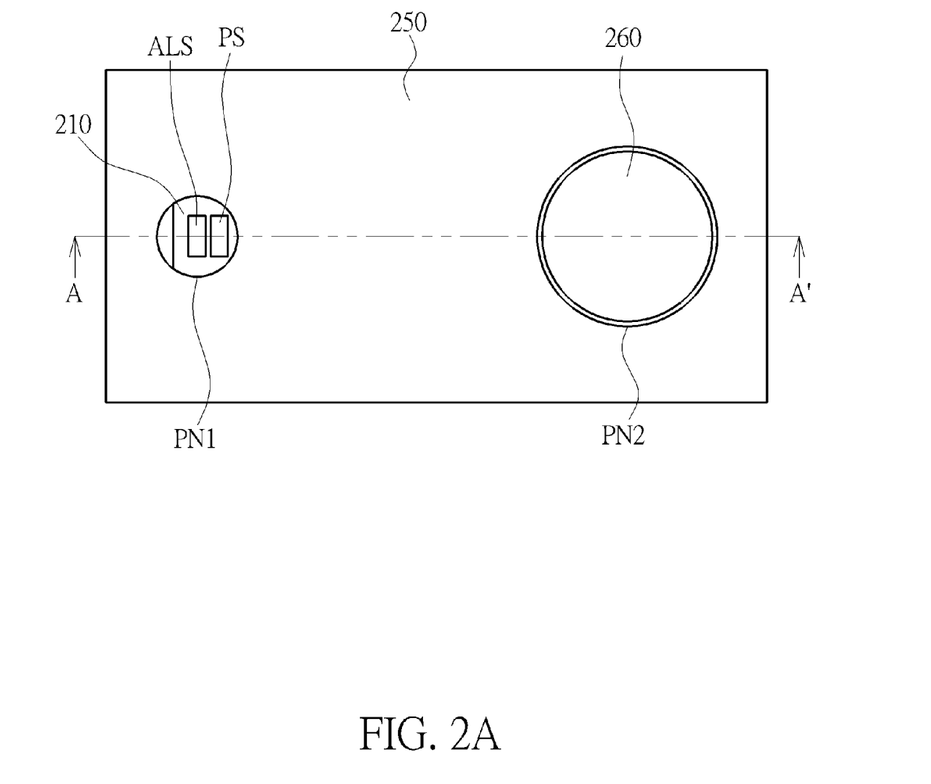
FIG. 2A is a schematic diagram of a sensor according to an embodiment of the present invention
Figure 2B:
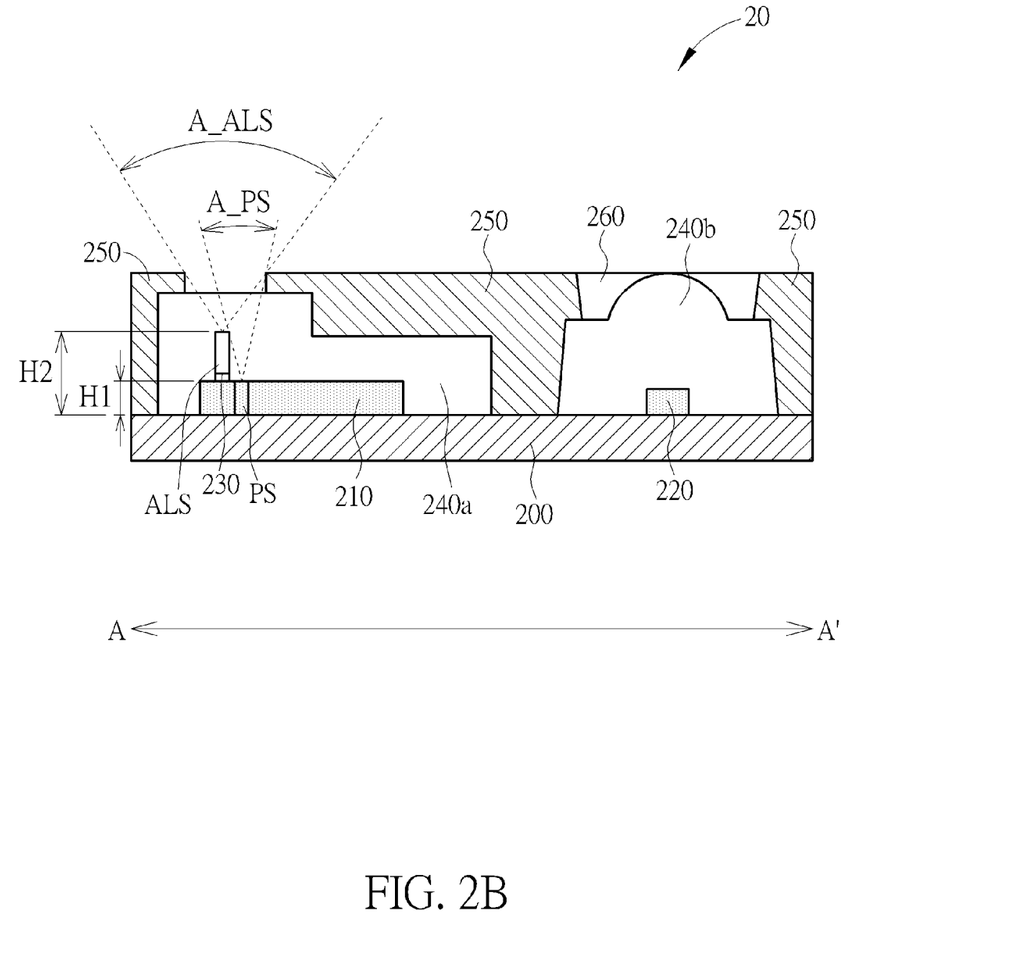
FIG. 2B is a schematic diagram of a cross plane of the sensor along a section line A-A' as shown in FIG. 2A.

Please refer to FIGS. 2A, 2B. FIG. 2A is a schematic diagram of a sensor 20 according to an embodiment of the present invention, and FIG. 2B is a schematic diagram of a cross plane of the sensor 20 along a section line A-A' as shown in FIG. 2A. The sensor 20 includes a substrate 200, an integrated circuit module 210, a signal emitting unit 220, an adhesive layer 230, a second receiving unit ALS, package bodies 240a, 240b, a package housing 250 and a signal diverging unit 260. The signal emitting unit 220 can be the proximity sensing element 120 as shown in FIG. 1, and emits signals of a first frequency band, such as an infrared frequency band, which is not limited to this. The integrated circuit module 210 includes a first receiving unit PS, the first receiving unit PS can be the proximity sensing element 130 as shown in FIG. 1. Therefore, when a signal emitted by the signal emitting unit 220 is reflect back to the first receiving unit PS by an object to be sensed, the first receiving unit PS senses the signal outputted by the signal emitting unit 220, and detects the object to be sensed, and determine a distance to the object to be sensed. The second receiving unit ALS can be the ambient sensing element 140 as shown in FIG. 1, and senses strength of ambient signals (such as ambient light) nearby the second receiving unit ALS, and thus sense signals of a second frequency band, wherein the second frequency band can cover or not cover the first frequency band. The package body 240a covers the first receiving unit PS, the second receiving unit ALS, and the package body 240b covers the signal emitting unit 220, respectively, and thus the package bodies 240a, 240b are made of material without obstructing effect, such as transparent material. The package housing 250 is disposed on the package bodies 240a, 240b, and includes openings PN1, PN2 for limiting signal path. Therefore, the package housing 250 is made of material with obstructing effect, such as non-transparent material. The signal diverging unit 260 can be a diverging lens (i.e. a concave lens), and adjust a path of the signals outputted by the signal emitting unit 220.

In short, in order to detect ambient signals (such as ambient light) in a wider range and ensure proximity sensing accuracy, a first height difference H1 between the first receiving unit PS and the substrate 200 is less than a second height difference H2 between the second receiving unit ALS and the substrate 200, and thus there is a height difference between the second receiving unit ALS and the first receiving unit PS. Besides, because a degree of a first light sensing angle A_PS of the first receiving unit PS is limited by the opening PN1 and the second receiving unit ALS, therefore, the first light sensing angle A_PS of the first receiving unit PS is less than a second light sensing angle A_ALS formed by the second receiving unit ALS and the opening PN1.

In detail, the first receiving unit PS and the second receiving unit ALS convert received signals (such as light signals) into currents or voltages, and output the currents or voltages to the integrated circuit module 210 for further processing. Therefore, the first receiving unit PS and the second receiving unit ALS can be photodiode, and are not limited to this. The second receiving unit ALS detects nearby ambient signals (such as ambient lights) to determine strength of ambient signals, to adjust light intensity of a display panel or provide data for the first receiving unit PS to calibrate accordingly. Because light intensity can be distributed unevenly in a space, the second receiving unit ALS can detect incident lights from each direction. In such a situation, the second light sensing angle A_ALS of the second receiving unit ALS should be enlarged to ensure the second receiving unit ALS to be capable of receiving lights in a wider range. As shown in FIG. 2B, a degree of the second light sensing angle A_ALS of the second receiving unit ALS is limited by the opening PN1 and the second height difference H2 of the second receiving unit ALS, wherein the second light sensing angle A_ALS relates to a range which the second receiving unit ALS is capable of receiving signals, and can be understood as angle of view in photography. Similarly, the first light sensing angle A_PS of the first receiving unit PS relates to a range which the first receiving unit PS is capable of receiving signals. However, because the first receiving unit PS detects whether an object to be sensed is in a specific direction according to whether the object to be sensed reflects signals emitted by the signal emitting unit 220, therefore, the first receiving unit PS does not need to enlarge the first light sensing angle A_PS. As shown in FIG. 2B, a degree of the first light sensing angle A_PS of the first receiving unit PS is limited by the opening PN1, the first height difference H1 of the first receiving unit PS and the second receiving unit ALS. Accordingly, when a difference between the first height difference H1 and the second height difference H2 is increased, there is no need to change an area of the opening PN1, so as to enlarge the second light sensing angle A_ALS of the second receiving unit ALS and minimize the first light sensing angle A_PS of the first receiving unit PS at the same time, thereby facilitating minimizing a size the sensor 20.

Figure 3A:
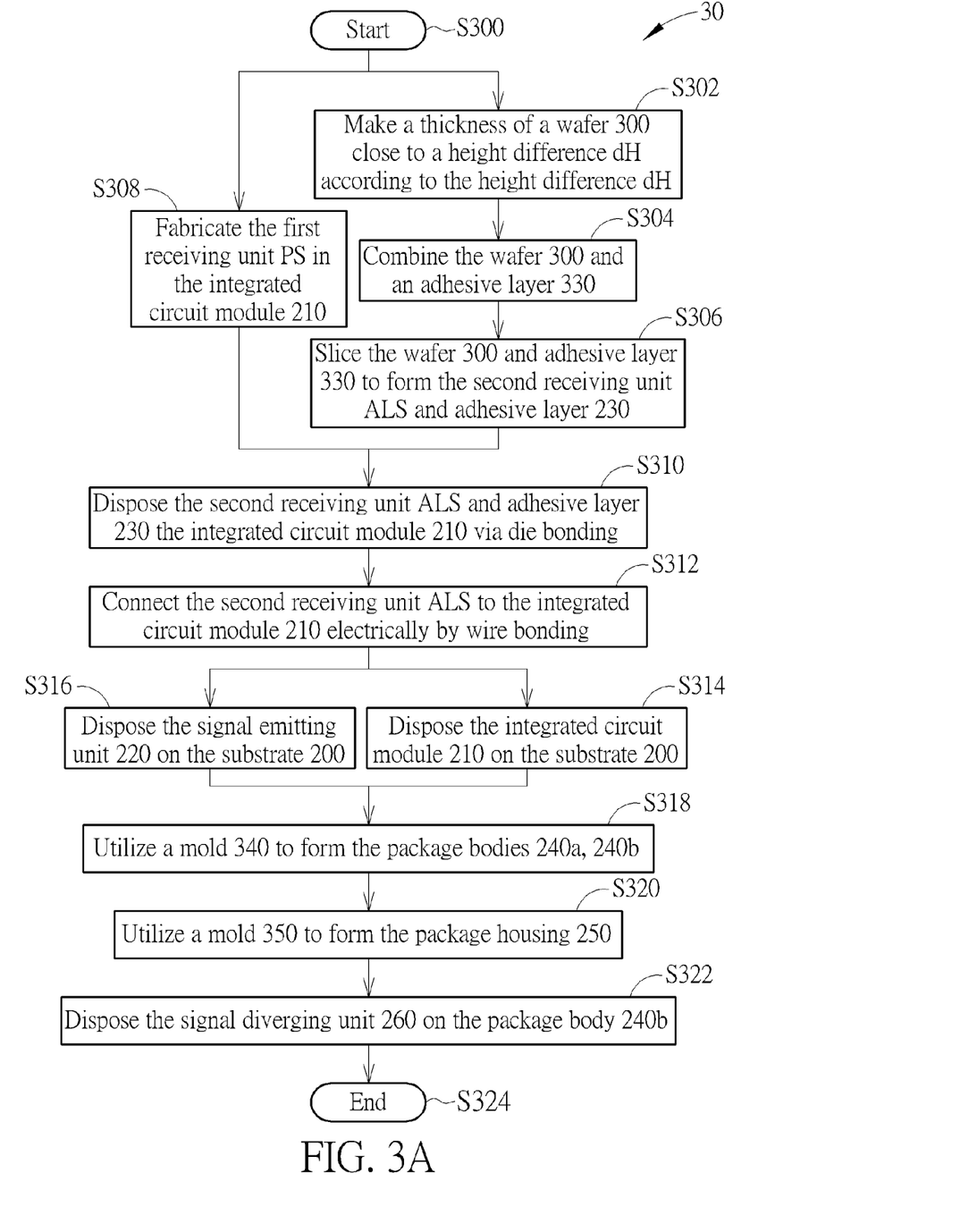
FIG. 3A is a schematic diagram of a sensor fabricating method of the sensor as shown in FIG. 2A according to an embodiment of the present invention.
Figure 3B:
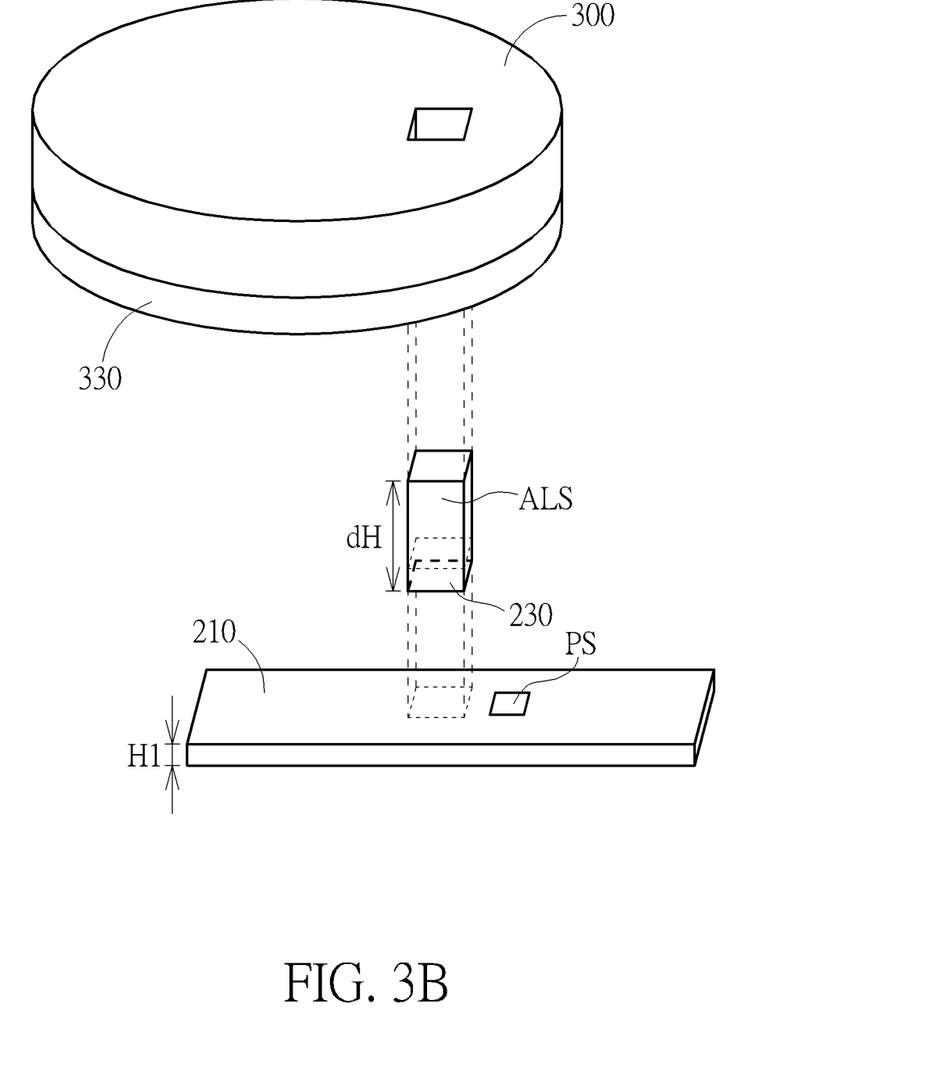
FIG. 3B is a schematic diagram of a relative relation when a first receiving unit and an integrated circuit module as shown in FIG. 2A are assembled in the sensor fabricating method as shown in FIG. 3A.
Figure 3C:
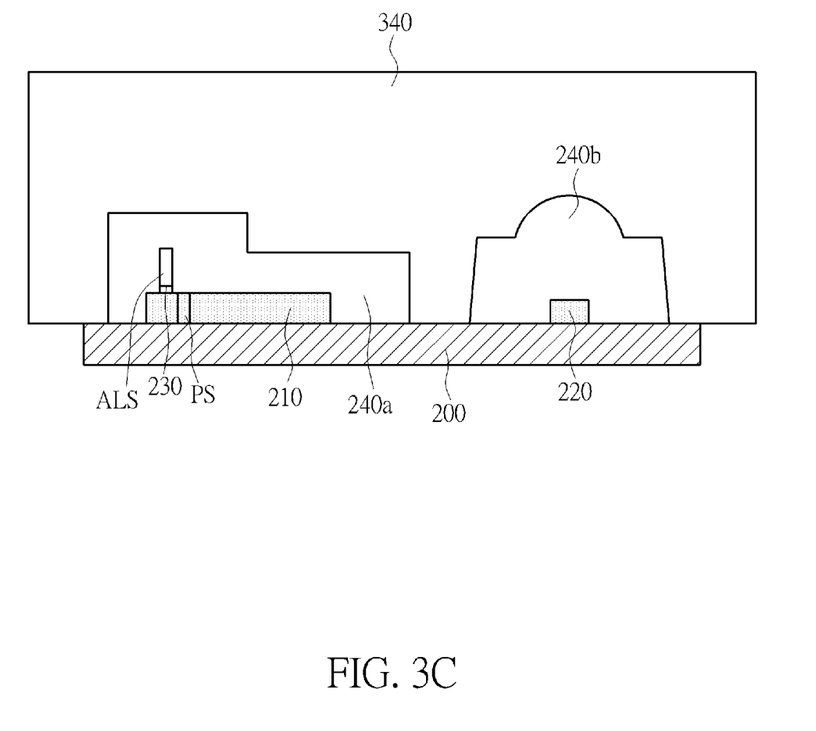
FIG. 3C is a schematic diagram of fabricating package bodies as shown in FIG. 2A in the sensor fabricating method as shown in FIG. 3A.
Figure 3D:
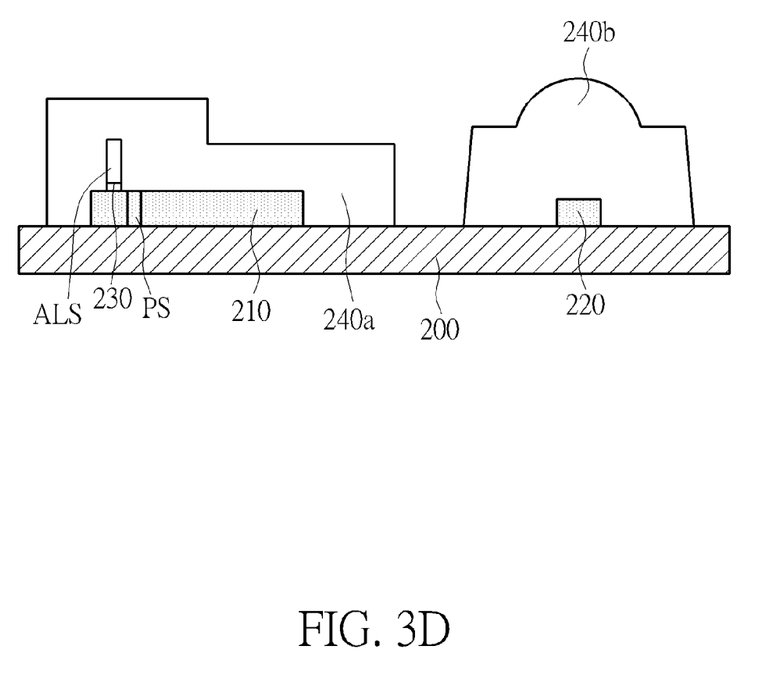
FIG. 3D is a schematic diagram of a relative relation when the package bodies as shown in FIG. 2A are formed in the sensor fabricating method 30 as shown in FIG. 3A.
Figure 3E:
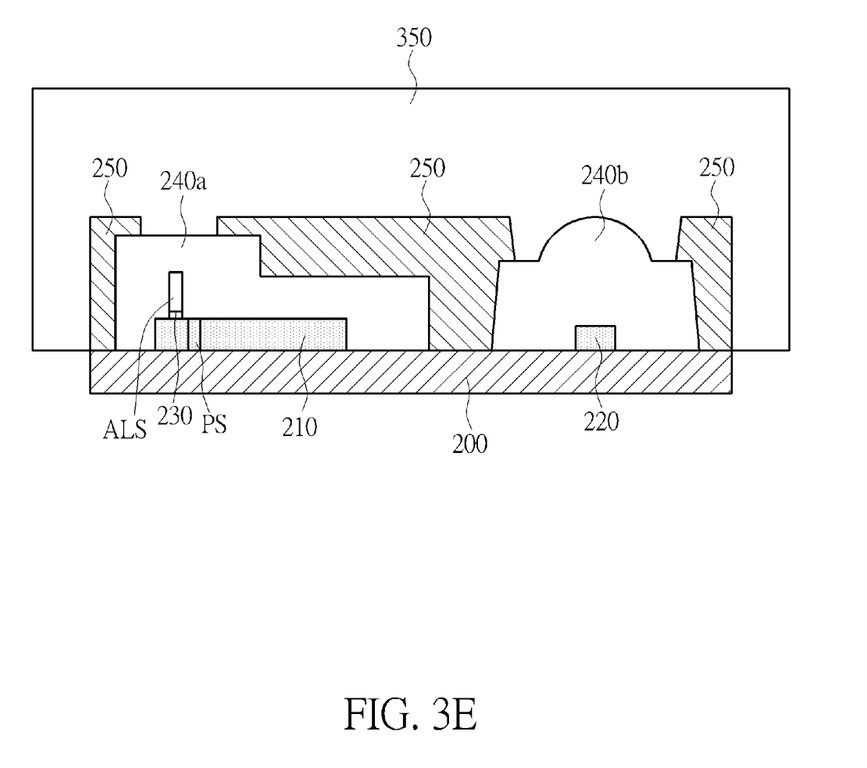
FIG. 3E is a schematic diagram of fabricating a package housing as shown in FIG. 2A in the sensor fabricating method as shown in FIG. 3A.

In order to embody the first height difference H1 of the first receiving unit PS different from the second height difference H2 of the second receiving unit ALS, please refer to FIGS. 3A to 3E. FIG. 3A is a schematic diagram of a sensor fabricating method 30 of the sensor 20 according to an embodiment of the present invention, FIG. 3B is a schematic diagram of a relative relation when the first receiving unit PS and the integrated circuit module 210 are assembled in the sensor fabricating method 30, FIG. 3C is a schematic diagram of fabricating the package bodies 240a, 240b in the sensor fabricating method 30, FIG. 3D is a schematic diagram of a relative relation when the package bodies 240a, 240b are formed in the sensor fabricating method 30, and FIG. 3E is a schematic diagram of fabricating the package housing 250 in the sensor fabricating method 30. The sensor fabricating method 30 includes following steps:

Step S300: Start.

Step S302: Make a thickness of a wafer 300 close to a height difference dH according to the height difference dH between the first height difference H1 and the second height difference H2.

Step S304: Combine the wafer 300 and an adhesive layer 330.

Step S306: Slice the wafer 300 and adhesive layer 330 to form the second receiving unit ALS and adhesive layer 230.

Step S308: Fabricate the first receiving unit PS in the integrated circuit module 210.

Step S310: Dispose the second receiving unit ALS and adhesive layer 230 on the integrated circuit module 210 via die bonding.

Step S312: Connect the second receiving unit ALS to the integrated circuit module 210 electrically by wire bonding.

Step S314: Dispose the integrated circuit module 210 on the substrate 200.

Step S316: Dispose the signal emitting unit 220 on the substrate 200.

Step S318: Utilize a mold 340 to form the package bodies 240a, 240b, wherein the package bodies 240a, 240b are disposed one the substrate 200, and cover the signal emitting unit 220, the first receiving unit PS and the second receiving unit ALS.

Step S320: Utilize a mold 350 to form the package housing 250, wherein the package housing 250 is disposed on the package bodies 240a, 240b.

Step S322: Dispose the signal diverging unit 260 on the package body 240b.

Step S324: End.

FIG. 3B illustrates a schematic diagram of a relative relation when the first receiving unit PS and the integrated circuit module 210 are assembled in the step S302 to the step S312. First, the thickness of a wafer 300 is adjust in the step S302, and the wafer 300 and adhesive layer 330 is combined via adhesive bonding in the step S304, such that there is the height difference dH between the second receiving unit ALS and the first receiving unit PS. The adhesive layer 330 can be adhesive material such as double-sided tape, but is not limited to this. Besides, as can be known from the step S306, the second receiving unit ALS is formed by slicing the wafer 300, but the wafer 300 can be sliced to form several second receiving units in practice. On the other hand, during the process of fabricating the integrated circuit module 210 in the step S308, the first receiving unit PS is directly formed in the integrated circuit module 210. Then, according to the step S310, the adhesive layer 230 is utilized to combine the second receiving unit ALS to the integrated circuit module 210. At this moment time, the die bonding between the second receiving unit ALS and the integrated circuit module 210 can be further strengthened by hardening, wherein the hardening can be performed by heating, ultraviolet irradiation or pressure according to character of the adhesive layer 230. Afterwards, in the step S312, the second receiving unit ALS is electrically connected to the integrated circuit module 210. Noticeably, the steps S304, S306 can be properly adjusted according to different design requirements. For example, the wafer 300 can be sliced to form the second receiving unit ALS first, and then the adhesive layer 230 is formed by a manner of glue dispensing, to combine the second receiving unit ALS with the integrated circuit module 210. The adhesive layer 230 can be adhesive material such as insulation gel, and is not limited to this. Besides, the step S302 can be properly adjusted according to different design requirements. For example, the thickness of the wafer 300 is different from the height difference dH, and a thickness of the adhesive layer 230 is utilized to form the height difference dH between the second receiving unit ALS and the first receiving unit PS. Otherwise, a middle layer can be disposed between the second receiving unit ALS and the integrated circuit module 210, to form the height difference dH between the second receiving unit ALS and the first receiving unit PS, wherein the middle layer can be a wafer bumping or a solder ball, and is not limited to this.

In the steps S314, S316, the integrated circuit module 210 and the signal emitting unit 220 are disposed on the substrate 200, respectively. Then, in the step S318, the mold 340 is disposed on the substrate 200 temporarily as shown in FIG. 3C, and material is injected into a space between the mold 340 and the substrate 200 by injection molding, such that the material is hardened according to a shape of the space to form the package bodies 240a, 240b. As shown in FIG. 3D, after the material is hardened, the mold 340 can be removed, and the package bodies 240a, 240b are left to cover the signal emitting unit 220, the first receiving unit PS and the second receiving unit ALS, respectively. Similarly, in the step S320, the mold 350 is disposed on the substrate 200 temporarily as shown in FIG. 3E, and material is injected into a space between the mold 350 and the substrate 200 by injection molding, such that the material is hardened according to a shape of the space to form the package housing 250. Therefore, after the material is hardened, the mold 350 can be removed, and the package housing 250 is left to cover the package bodies 240a, 240b and the substrate 200. As such, the package housing 250 is directly formed on the package bodies 240a, 240b and the substrate 200, wherein the molds 340, 350 are tools for mass element fabrication, and can be properly designed to form the opening PN1, PN2 on the package housing 250. Besides, the material can be material such as glass, elastomer, thermoplastic or thermosetting polymer etc. according to different system requirements, and is not limited to this. For example, the package housing 250 can be made of non-transparent material, and the package bodies 240a, 240b can be made of transparent material, and thus the package bodies 240a, 240b can be omitted and only air is stuffed instead. Finally, in the step S322, the signal diverging unit 260 is disposed in the opening PN2 of the package housing 250 according to a position of the signal emitting unit 220, to fabricate the sensor 20 in FIGS. 2A, 2B.

Figure 4A:
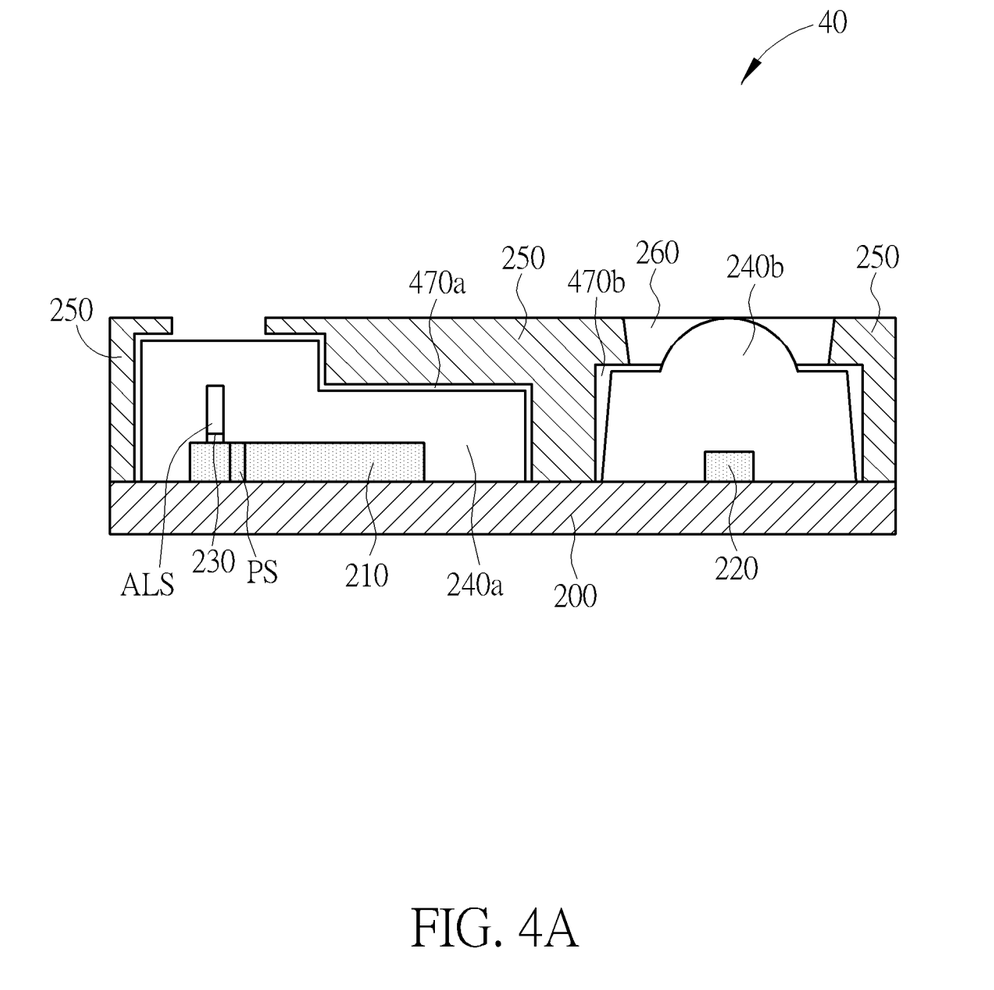
FIG. 4A is a schematic diagram of a sensor according to another embodiment of the present invention.
Figure 4B:
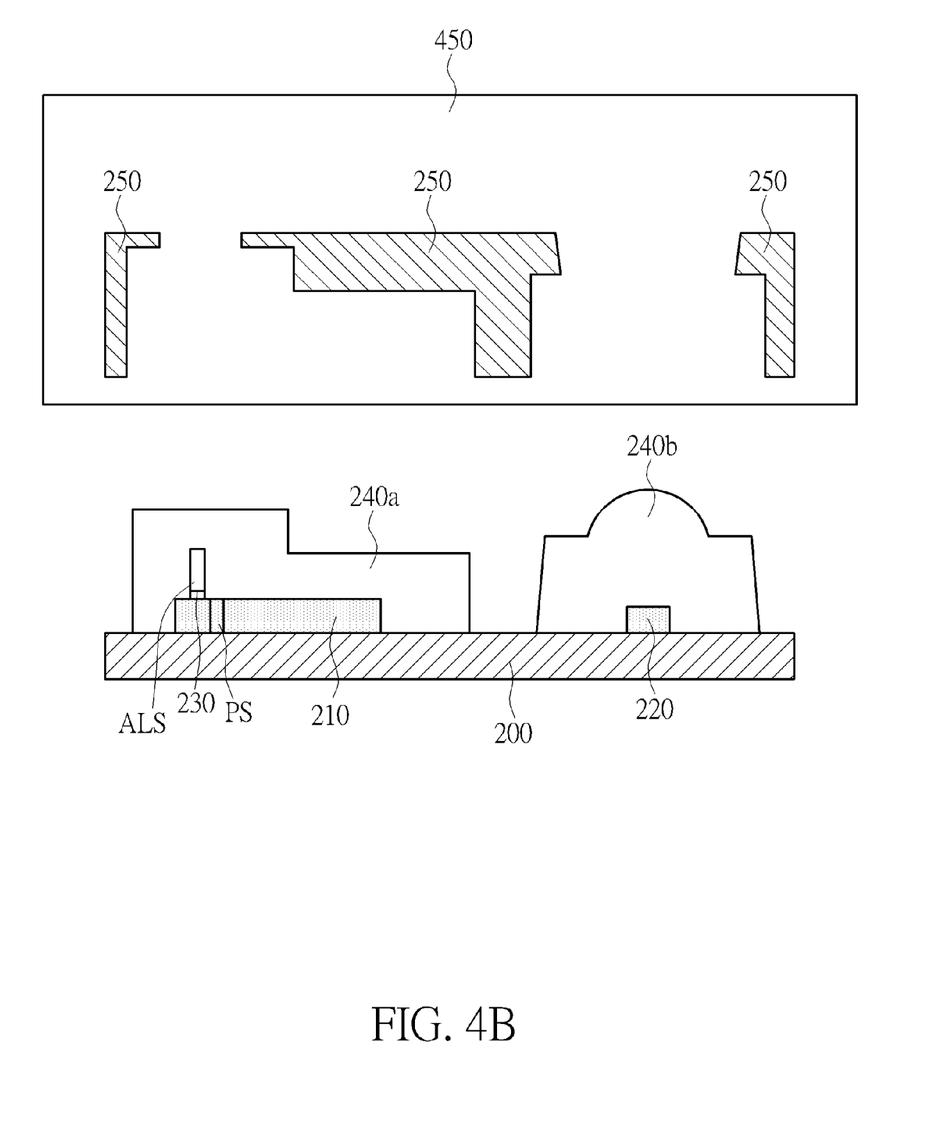
FIG. 4B is a schematic diagram of fabricating and disposing a package housing as shown in FIG. 4A.

Noticeably, the above sensor 20 and the above sensor fabricating method 30 are embodiments of the present invention, and are not limited to this. Those skilled in the art can make modifications and alterations according to system requirements. The sensor fabricating method can be properly adjusted according to different design requirements and, to change the structure of the sensor. For example, please refer to FIGS. 4A, 4B, FIG. 4A is a schematic diagram of a sensor 40 according to an embodiment of the present invention, and FIG. 4B is a schematic diagram of fabricating and disposing the package housing 250. A structure of the sensor 40 is similar to a structure of the sensor 20, and thus the same elements are denoted by the same symbols. Differences between the sensor 40 and the sensor 20 are that the sensor 40 further comprises air layers 470a, 470b disposed between the package bodies 240a, 240b and the package housing 250, respectively. Besides, a sensor fabricating method of the sensor 40 is similar with the sensor fabricating method 30 of the sensor 20, and is not narrated hereinafter. Differences between the sensor fabricating method of the sensor 40 and the sensor fabricating method 30 are that the step S320 of the sensor fabricating method 30 disposes the mold 350 on the substrate 200 temporarily, and injects the material into the space between the mold 350 and the substrate 200, such that the material is hardened according to the shape of the space to form the package housing 250. However, as shown in FIG. 4B, in order to fabricate the package housing 250 of the sensor 40, it is necessary to inject material into a mold 450 additionally, to form the package housing 250 individually by injection molding. Then, the package housing 250 is separated from the mold 450, and the package housing 250 is disposed on the package bodies 240a, 240b and the substrate 200 via assembling. Since the package housing 250 is combined with the package bodies 240a, 240b and the substrate 200 via assembling, the air layers 470a, 470b are formed between the package bodies 240a, 240b and the package housing 250.

Figure 5:
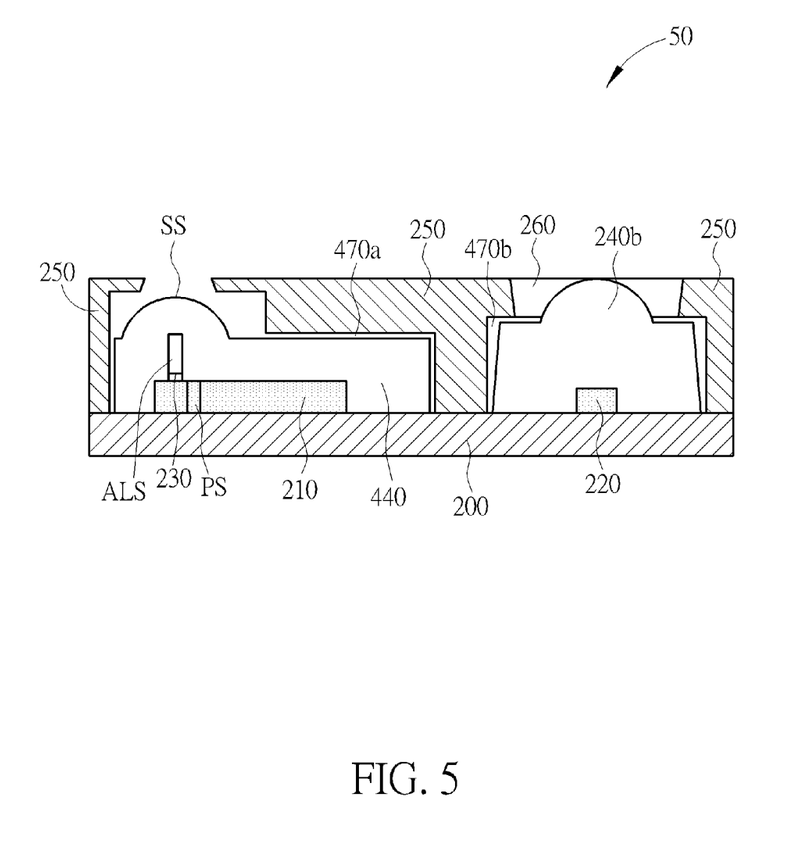
FIG. 5 is a schematic diagram of a sensor according to another embodiment of the present invention.

In order to enhance light receiving capability, a structure of a sensor can be further adjusted. For example, please refer to FIG. 5, which is a schematic diagram of a sensor 50 according to an embodiment of the present invention. A structure of the sensor 50 is similar with that of the sensor 40, and thus the same elements are denoted by the same symbols. Differences between the sensor 50 and the sensor 40 are that a package body 440 of the sensor 50 includes a curved surface structure SS in comparison with the package body 240a of the sensor 40, and the curved surface structure SS is corresponding to the opening PN1 of the package housing 250, and focus lights to the first receiving unit PS. Therefore, signals reflected by an object to be sensed and nearby ambient signals (such as ambient lights) shift or refract to a proper direction after passing through the curved surface structure SS to the first receiving unit PS and the second receiving unit ALS, and are focused to the first receiving unit PS, thereby enhancing light receiving capability and further increasing detectable distance of high proximity sensing. Noticeably, the structure of the sensor 50 can also be similar with the sensor 20, and does not include the air layers 470a, 470b, and only the package body 44 of the sensor 50 includes the curved surface structure SS.

Figure 6:
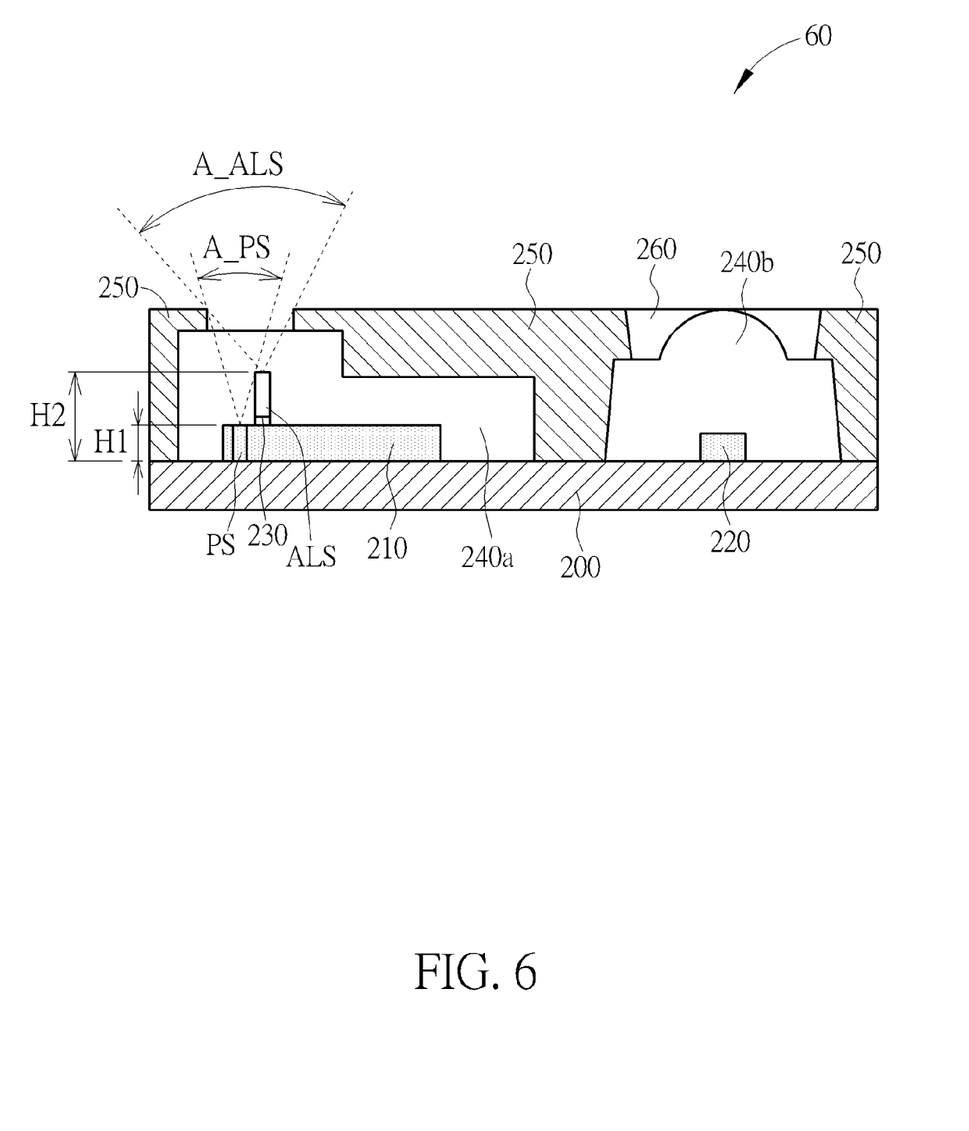
FIG. 6 is a schematic diagram of a sensor according to another embodiment of the present invention.

On the other hand, after the signal emitting unit 220 emits signals of the first frequency band, other than emitting out of the sensor 20 via the opening PN2, the signals can also be reflected by internal elements of the sensor 20. Besides, the package housing 250 may not shield all signals reflected by internal elements. Therefore, a portion of signals emitted by the signal emitting unit 220 may leak to the first receiving unit PS, and affect sensing accuracy. More importantly, because of needs of minimization of the sensor 20, interference from the signal emitting unit 220 to the first receiving unit PS is more severe. In order to reduce the interference from the signal emitting unit 220 to the first receiving unit PS, the structure of the sensor can be further adjusted. For example, please refer to FIG. 6, which is a schematic diagram of a sensor 60 according to an embodiment of the present invention. A structure of the sensor 60 is similar with that of the sensor 20, and thus the same elements are denoted by the same symbols. Differences between the sensor 60 and the sensor 20 are that, the first receiving unit PS of the sensor 20 is disposed between the second receiving unit ALS and the signal emitting unit 220, while the second receiving unit ALS of the sensor 60 is disposed between the first receiving unit PS and the signal emitting unit 220. As shown in FIG. 6, via the second receiving unit ALS, leaked signals from the signal emitting unit 220 can be further shielded, thereby reducing interference from the signal emitting unit 220 to the first receiving unit PS.

To sum up, there is a height difference between the second receiving unit ALS and the first receiving unit PS in the sensor of the above embodiments, such that the first light sensing angle A_PS of the first receiving unit PS is less than the second light sensing angle A_ALS of the second receiving unit ALS, Therefore, the sensor of the above embodiments can detect ambient signals in a wider range and ensure proximity sensing accuracy.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sensor, comprising:
   a first receiving unit, for sensing a first signal of a first frequency band along a direction;
   a second receiving unit, for sensing a second signal of a second frequency band, wherein there is a height difference between the second receiving unit and the first receiving unit along the direction;
   a substrate, wherein the first receiving unit and the second receiving unit are disposed on the substrate, and a second height difference between the second receiving unit and the substrate is greater than a first height difference between the first receiving unit and the substrate;
   a package body, disposed on the substrate, for covering the first receiving unit and the second receiving unit; and
   a package housing, disposed on the package body and comprising an opening, wherein a first light sensing angle of the first receiving unit is smaller than a second light sensing angle formed by the second receiving unit and the opening, and a degree of the first light sensing angle is limited by the second receiving unit.

2. The sensor of claim 1, wherein the first frequency band is an infrared frequency band, and the second frequency band is a frequency band of a nearby ambient light source of the second receiving unit.

3. The sensor of claim 1 further comprising:
   a signal emitting unit, disposed on the substrate, for outputting the first signal, wherein the first receiving unit senses the first signal when the first signal emitted by the signal emitting unit is reflected back to the first receiving unit by an object to be sensed.

* * * * *